(12) United States Patent
Kye et al.

(10) Patent No.: US 8,031,512 B2
(45) Date of Patent: Oct. 4, 2011

(54) MULTIPLE-VALUED DRAM

(75) Inventors: Hun Woo Kye, Icheon-si (KR); Bok-Nam Song, Seongnam-si (KR); Jung Bum Choi, Cheongju-si (KR)

(73) Assignees: Chungbuk National University Industry-Academic Cooperation Foundation (KR); Bok Nam Song (KR); Jung Bum Choi (KR)

( * ) Notice: Subject to any disclaimer, the term of this patent is extended or adjusted under 35 U.S.C. 154(b) by 609 days.

(21) Appl. No.: 11/993,413

(22) PCT Filed: Sep. 11, 2006

(86) PCT No.: PCT/KR2006/003610
§ 371 (c)(1),
(2), (4) Date: Dec. 20, 2007

(87) PCT Pub. No.: WO2007/029992
PCT Pub. Date: Mar. 15, 2007

(65) Prior Publication Data
US 2010/0157660 A1    Jun. 24, 2010

(30) Foreign Application Priority Data
Sep. 9, 2005 (KR) .................. 10-2005-0084300

(51) Int. Cl.
*G11C 11/24* (2006.01)

(52) U.S. Cl. .................. 365/149; 365/150; 365/189.05; 365/189.09

(58) Field of Classification Search .................. 365/149, 365/150, 189.09, 189.05
See application file for complete search history.

(56) References Cited

U.S. PATENT DOCUMENTS

| | | | |
|---|---|---|---|
| 5,640,350 A | | 6/1997 | Iga |
| 5,982,676 A | * | 11/1999 | Poplevine et al. ....... 365/189.06 |
| 6,246,622 B1 | | 6/2001 | Sugibayashi |
| 6,282,115 B1 | * | 8/2001 | Furukawa et al. ............ 365/149 |
| 6,469,923 B1 | * | 10/2002 | Hidaka ........................ 365/149 |
| 7,336,521 B2 | * | 2/2008 | Chen ............................. 365/149 |

OTHER PUBLICATIONS

International Search Report for PCT/KR2006/003610 mailed Dec. 14, 2006.
Written Opinion for PCT/KR2006/003610 mailed Dec. 14, 2006.

* cited by examiner

*Primary Examiner* — Pho M Luu
(74) *Attorney, Agent, or Firm* — Cantor Colburn LLP

(57) ABSTRACT

Provided herein is an MV DRAM device for storing multiple value levels using an SET device. The device includes one or more word lines; one or more bitlines; a DRAM cell connected to intersections of the word lines and the bitlines; a current source transistor having a source connected to a power supply voltage and a gate and a drain connected to the bitlines; an SET (single electron transistor) device having a gate connected to the bitlines and a source connected to the ground voltage; and a transistor connected between the bitlines and the drain of the SET device, where the gate of the transistor is connected to the ground voltage.

6 Claims, 5 Drawing Sheets

[Fig. 1]
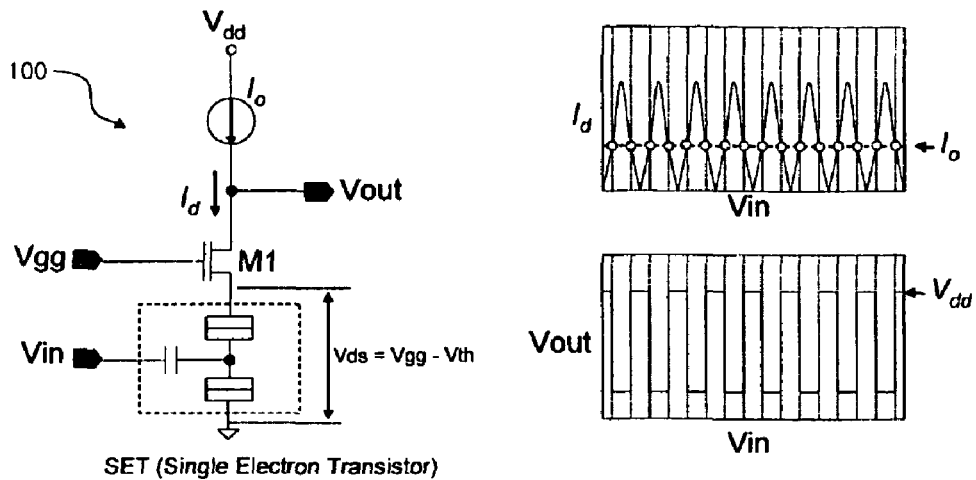
[Fig. 2]
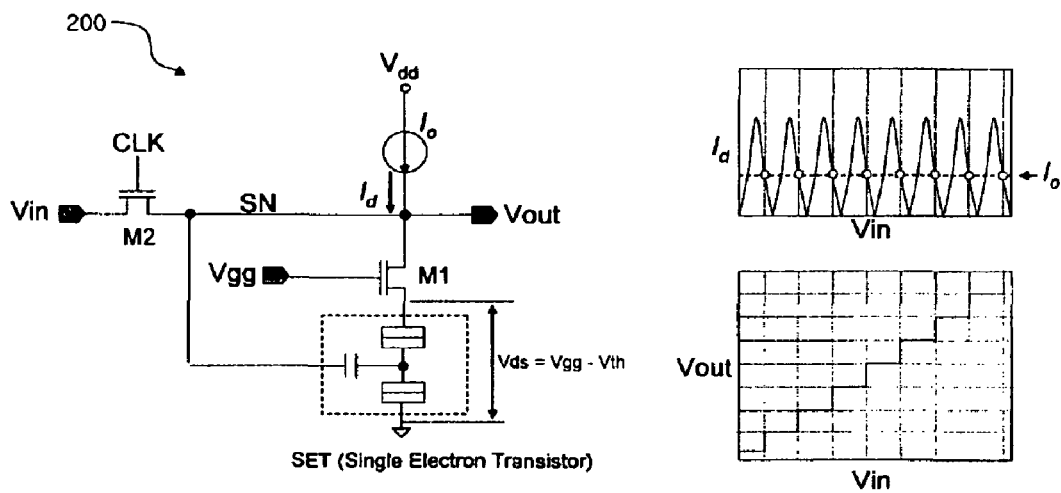
[Fig. 3]
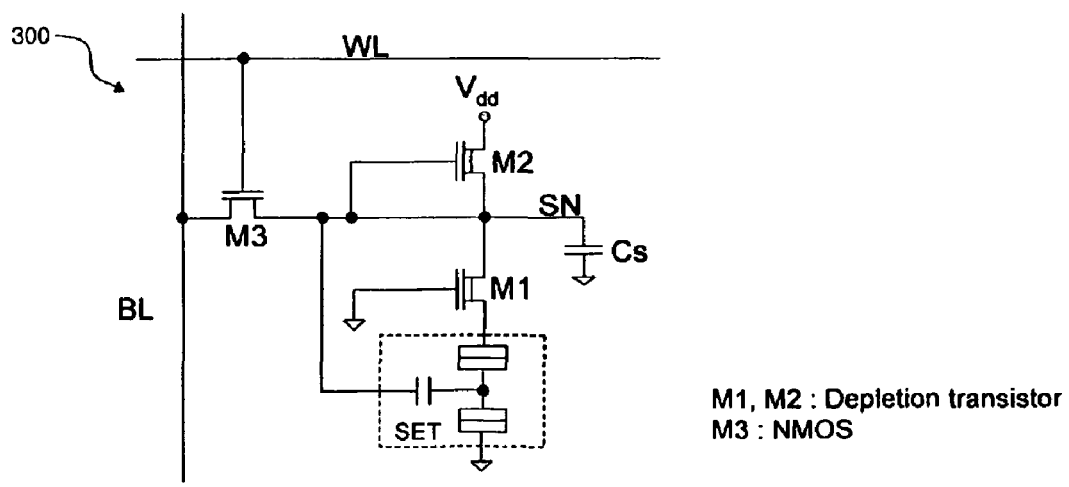
M1, M2 : Depletion transistor
M3 : NMOS

[Fig. 4]
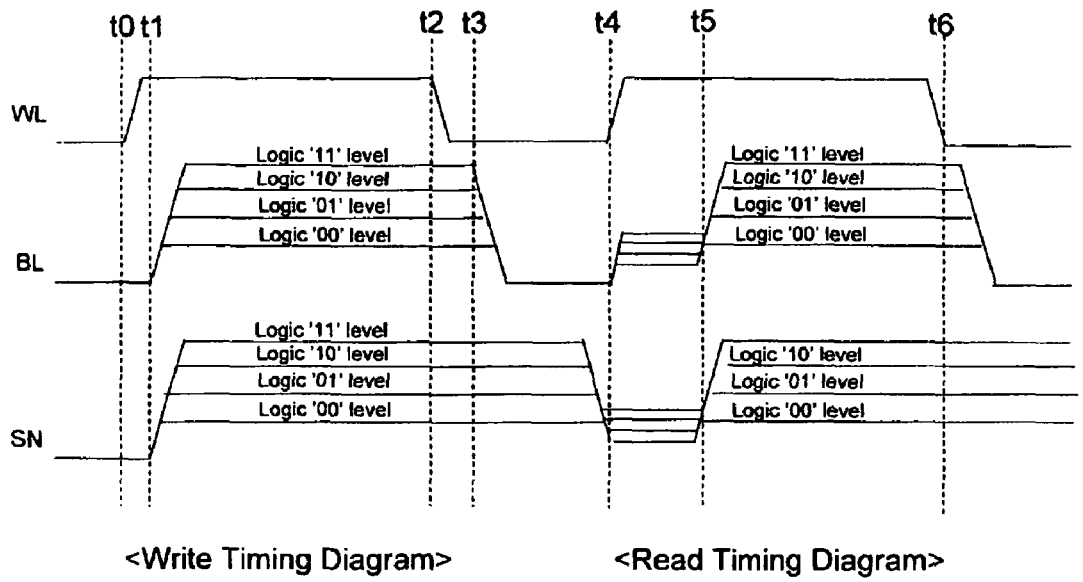
<Write Timing Diagram>      <Read Timing Diagram>
[Fig. 5]
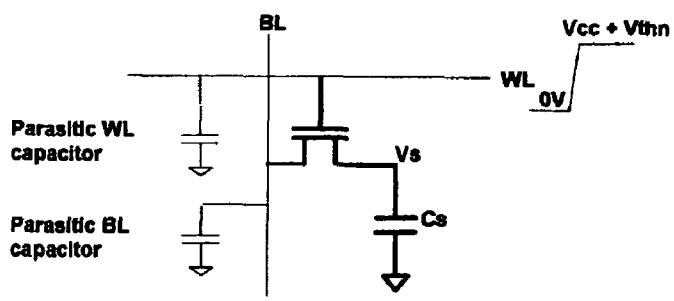
[Fig. 6]
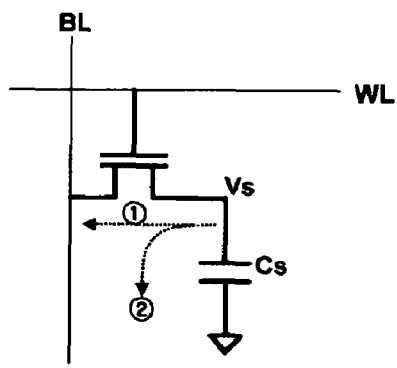
① : Subthreshold leakage
② : Junction leakage

[Fig. 7]
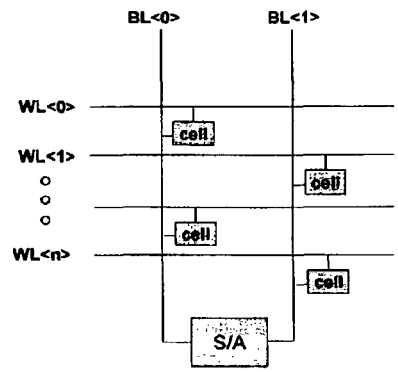
[Fig. 8]
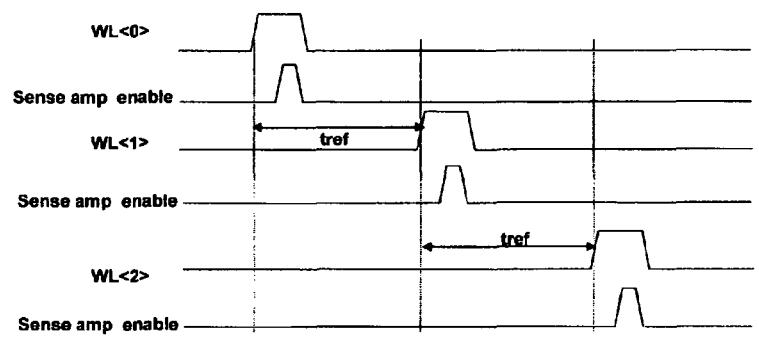
[Fig. 9]
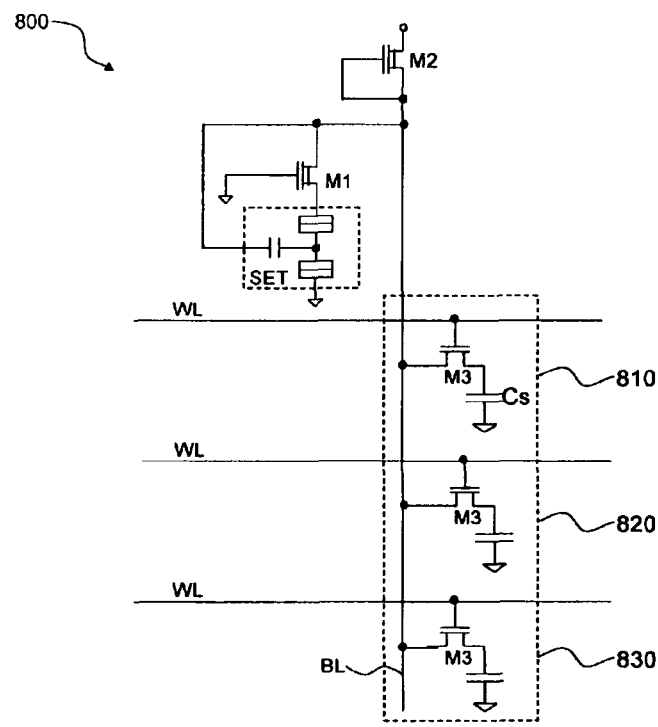

[Fig. 10]
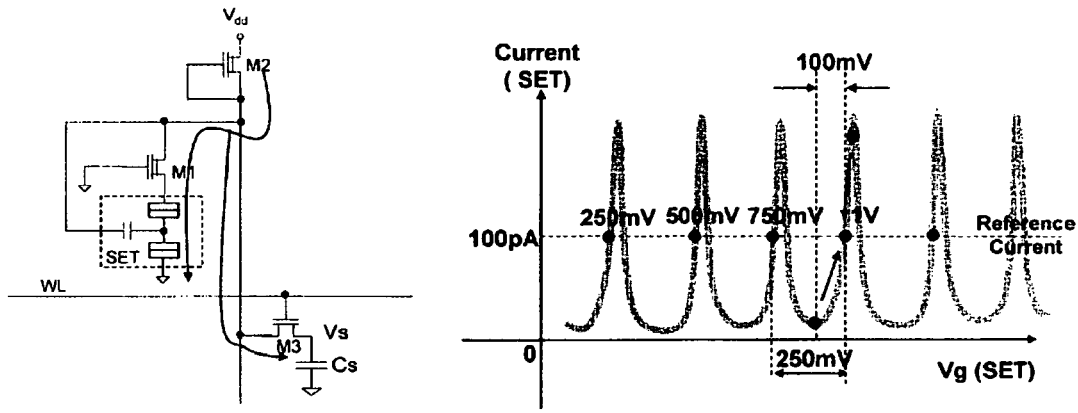
[Fig. 11]
[Fig. 12]
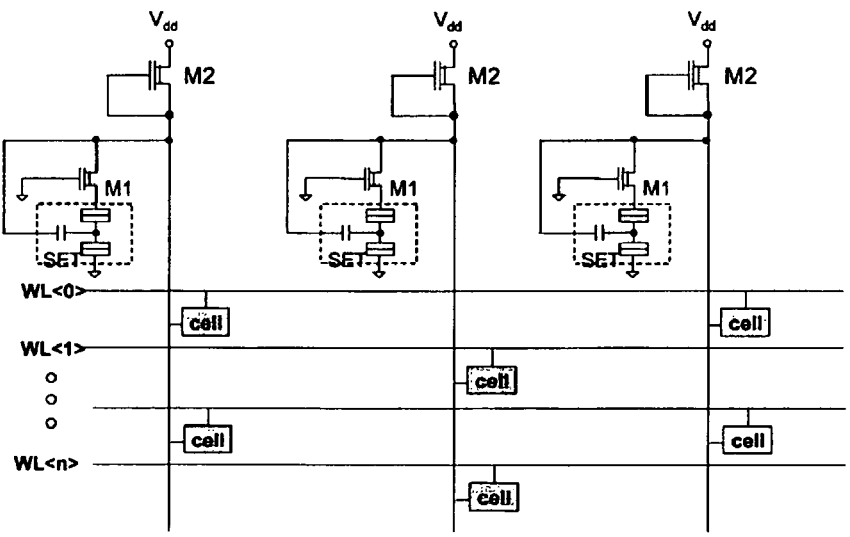

[Fig. 13]
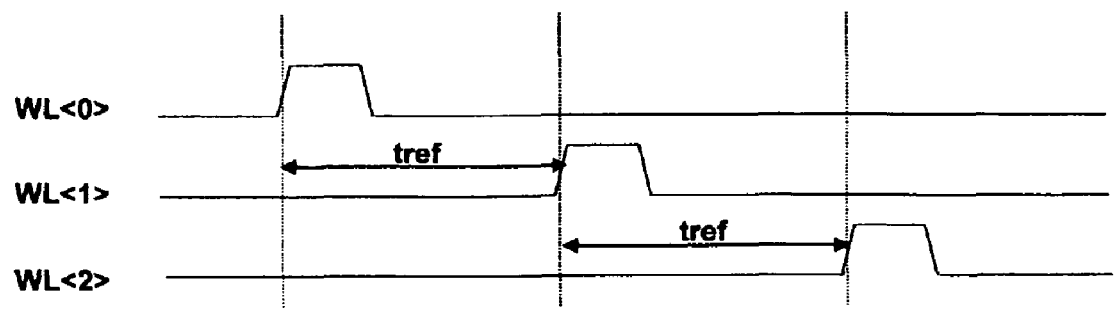

MULTIPLE-VALUED DRAM

BACKGROUND

1. Field of the Invention

The present invention relates to a semiconductor memory apparatus and more particularly, to a multiple-valued (MV) dynamic random-access-memory (DRAM) device capable of storing multiple value levels using a single electron transistor (SET) device.

2. Description of the Related Art

Recently, a research has been conducted on an SET. The SET has advantages of increasing the integration degree of a circuit and decreasing power consumption. The SET also has inherent characteristics that the drain current of the SET increases and decreases periodically according to a gate bias. Researchers have made an effort to increase functionality of a circuit with fewer transistors by using such characteristics. In particular, the SET device has been proven to have characteristics highly suitable for applications in a multiple-valued logic circuit and therefore, incessant efforts have been made to use the SET device for the multiple-valued logic circuit application.

FIG. 1 is a diagram for explaining a universal lateral gate 100 in which a single electron transistor (SET) device and a metal-oxide-semiconductor (MOS) transistor are coupled to each other.

Referring to FIG. 1, when a constant voltage Vgg is applied to the gate of a transistor M1, the drain voltage Vds of the SET is maintained at a constant voltage equal to Vgg-Vth. Since the voltage Vgg-Vth is low enough to satisfy a Coulomb blockage condition, the SET shows characteristics that the drain current of the SET increases and decreases periodically according to an input voltage Vin. In this case, a constant current Io is supplied from a constant current source to the drain of the SET.

When the input voltage Vin is changed so as to increase the drain current of the SET to a current higher than the current Io supplied from the constant current source, the output voltage Vout will be rapidly decreased from a high level to a low level. On the other hand, when the input voltage Vin is changed so as to decrease the drain current of the SET to a current lower than the current Io supplied from the constant current source, the output voltage Vout will be rapidly increased from a low level to a high level.

Therefore, when the input voltage Vin is increased, the output voltage Vout of the universal lateral gate 100 may have a square waveform with a high voltage swing.

FIG. 2 is a diagram showing an exemplary circuit of a quantizer 200 using the universal lateral gate 100 of FIG. 1.

Referring to FIG. 2, the constant current source provides a number of stability points and the quantizer 200 operates in stable regions defined by dotted lines between two neighboring stability points. More particularly, when a clock signal CLK is enabled, an input voltage Vin is transferred to a storage node SN through a transistor M2 and quantized to a stability point corresponding to the voltage after the clock signal CLK is cut off. Accordingly, it is possible to obtain an input-output (Vin-Vout) voltage characteristic similar to a stepped waveform.

The quantizer 200 having the SET device and the MOS transistor coupled to each other can be used for a memory application. In particular, since the quantizer 200 can store multiple level voltages without performing an additional refresh operation, it is highly effective in a multiple-valued static memory.

FIG. 3 is a circuit diagram showing a DRAM type multiple-valued (MV) static random-access-memory (SRAM) using the quantizer 200 of FIG. 2.

Referring to FIG. 3, an MV SRAM cell 300 includes a first transistor M1 connected between an SET and a storage node SN and having a gate connected to the ground voltage; a second transistor M2 connected between a power supply voltage Vdd and the storage node SN and having a gate connected to the storage node SN; a third transistor M3 connected between a bitline BL and the storage node SN and having a gate connected to a word line WL; and a cell capacitor Cs connected between the storage node SN and the ground voltage. The first and second transistors M1 and M2 are depletion transistors and the third transistor M3 is an NMOS transistor.

FIG. 4 is a timing diagram showing write and read operations of the MV SRAM shown in FIG. 3.

Referring to FIG. 4, during a write operation, the word line WL is enabled at t0. After the word line WL is enabled, a voltage corresponding to a multiple logic value is applied to the bitline BL at t1. In order to store two bits in each cell, voltages having four different levels need to be applied to the storage node SN through the bitline BL. When corresponding voltage levels are transferred to the storage node SN, the word line WL is cut off at t2 and the bitline BL is precharged to the ground voltage at t3. Accordingly, the voltage levels stored in the storage node SN are maintained without being refreshed in accordance with the principle of the stability point of an operation of the quantizer 200 in FIG. 2.

During a read operation, the word line WL is enabled at t4 and electric charges stored in the cell capacitor Cs are shared with a parasitic capacitor of the bitline BL. At t5, a sense amplifier is enabled so as to sense the multiple value levels.

However, since the MV SRAM cell includes four transistors and one capacitor, the chip size of the MV SRAM cell is increased. A multiple-valued memory is advantageous in that it increases storage density by increasing the number of bits stored in a cell but disadvantageous in that it decreases the number of device used in the cell, thereby defeating the advantages of the MV SRAM.

FIG. 5 is a diagram showing a 1T1C (1 transistor and 1 capacitor) cell of a DRAM.

Referring to FIG. 5, when electric charges are stored in a storage node Vs of a cell capacitor Cs, data is stored in the storage node Vs. The DRAM has a structure in which parasitic capacitors exist in bitlines and word lines. When the data is read from the DRAM, the electric charges stored in the cell capacitor Cs are shared with the parasitic capacitor of the bitline and the voltage level of the bitline is sensed, thereby reading the data.

FIG. 6 is a diagram for explaining a leakage current path viewed from the storage node Vs shown in FIG. 5.

Referring to FIG. 6, the electric charges stored in the cell capacitor Cs are decreased due to a junction leakage current and a sub-threshold current. Therefore, the level of the electric charges stored in the cell capacitor Cs is decreased over time. Accordingly, a refresh operation needs to be performed before the data is destroyed due to loss of the electric charge.

FIGS. 7 and 8 are diagrams showing a structure of a DRAM cell array and timings for a refresh operation.

Referring to FIGS. 7 and 8, the word lines WL are sequentially enabled for every refresh period tref before the electric charges stored in the cell capacitor Cs of the DRAM are lost. Thereafter, the voltage levels stored in the bitlines BL are sensed and amplified using a sense amplifier S/A and data is rewritten, thereby completing the data refresh operation. However, in the DRAM, a large amount of electric current is consumed in order to charge and discharge a relatively large parasitic capacitor of the bitline. Since this consumed electric current increases a standby current, the DRAM is not suitable for a low-power application.

SUMMARY

The present invention is contrived to solve the above-mentioned problem. An advantage of the present invention is that it provides a multiple-valued (MV) DRAM device capable of storing multiple valued data other than binary data in a DRAM cell.

Another advantage of the present invention is that it provides an MV DRAM device applicable to a low-power application by eliminating a sense amplifier for a refresh operation using a Coulomb blockage characteristic of a single electron transistor (SET) device.

According to an aspect of the invention, there is provided an MV (multiple-valued) DRAM device for storing multiple value levels, the device including: one or more word lines; one or more bitlines; a DRAM cell connected to intersections of the word lines and the bitlines; a current source transistor having a source connected to a power supply voltage and a gate and a drain connected to the bitlines; an SET (single electron transistor) device having a gate connected to the bitlines and a source connected to the ground voltage; and a transistor connected between the bitlines and the drain of the SET device, wherein the gate of the transistor is connected to the ground voltage.

In the embodiments of the present invention, the DRAM cell may include a cell transistor having a gate connected to the word lines and a drain connected to the bitlines; and a cell capacitor connected between the source of the cell transistor and the ground voltage.

In the embodiments of the present invention, the SET device may include the source and the drain formed on a semiconductor substrate; a metal island disposed between the source and the drain so as to form a tunnel junction between the source and the drain; and the gate disposed in the vicinity of the metal island so as to control electric current flowing through the metal island.

In the embodiments of the present invention, the transistor connected between the bitlines and the drain of the SET device is a depletion transistor that maintains the drain voltage level of the SET device at the ground voltage, and the current source transistor is a depletion transistor.

In the embodiments of the present invention, data stored in the DRAM cell may be refreshed when the word lines are enabled.

In the embodiments of the present invention, the MV DRAM device may further include a plurality of DRAM cells connected to intersections of a plurality of word lines and a plurality of bitlines, and the word lines are sequentially enabled at a predetermined period in order to refresh the DRAM cells.

According to the MV DRAM device of the present invention, since two or more multiple value data are stored in a cell, it is possible to increase the storage density of the device. In addition, since the MV DRAM device only needs to enable the word lines in order to rewrite the data, thereby requiring only a small amount of current flow, it is suitable for a low-power application.

BRIEF DESCRIPTION OF THE DRAWINGS

The above and other features and advantages of the present invention will become more apparent by describing in detail exemplary embodiments thereof with reference to the attached drawings in which:

FIG. 1 is a diagram for explaining a universal lateral gate 100 in which a single electron transistor (SET) device and a metal-oxide-semiconductor (MOS) transistor are coupled to each other;

FIG. 2 is a diagram showing an exemplary circuit of a quantizer 200 using the universal lateral gate shown in FIG. 1;

FIG. 3 is a circuit diagram showing a DRAM type multiple-valued (MV) static random-access-memory (SRAM) using the quantizer of FIG. 2;

FIG. 4 is a timing diagram showing write and reed operations of the MV SRAM shown in FIG. 3;

FIG. 5 is a diagram showing a 1T1C (1 transistor and 1 capacitor) cell of a DRAM;

FIG. 6 is a diagram for explaining a leakage current path seen from the storage node Vs shown in FIG. 5;

FIGS. 7 and 8 are diagrams showing a structure of a DRAM cell array and timings for a refresh operation;

FIG. 9 is a diagram showing an MV DRAM using an SET device according to an embodiment of the present invention;

FIG. 10 is a diagram showing exemplary voltage characteristics of a storage node Vs in the case of the binary data and two bit multiple value data;

FIG. 11 is a diagram for explaining a refreshing method of an MV DRAM according to an embodiment of the present invention;

FIG. 12 is a diagram showing an MV DRAM cell array according to an embodiment of the present invention; and FIG. 13 is a diagram for explaining a refreshing method of an MV DRAM cell array shown in FIG. 12.

DESCRIPTION OF THE EXEMPLARY EMBODIMENTS

Hereinafter, exemplary embodiments of the present invention will be described in detail with reference to the attached drawings so that those skilled in the art can easily put the invention into practice. However, the invention may be embodied in a variety of forms, but is not limited to the exemplary embodiments. Like reference numerals in the drawings denote like elements.

FIG. 9 is a diagram showing an MV DRAM using an SET device according to an embodiment of the present invention.

Referring to FIG. 9, in an MV DRAM 800, a plurality of unit cells 810, 820, and 830 are arrayed at intersections of word lines WL and bitlines BL. The unit cells 810, 820, and 830 include one transistor M3 and one capacitor Cs similar to the DRAM. The bitline BL is connected to a current source transistor M2 for performing a refresh operation on the unit cells 810, 820, and 830. The bitline BL is also connected to an SET device and a first transistor M1.

The SET device includes a tunnel junction formed between a source and a drain of the SET device and a metal island disposed between the source and the drain. The gate of the SET device is disposed in the vicinity of the metal island and controls electric current flowing through the metal island.

In the unit cells 810, 820, and 830, multiple value data is stored unlike the DRAM where binary data is stored. In the binary data storing method, a cell can store only one bit. However, in the multiple value data storing method, a cell can store two or more data, thereby advantageously increasing the storage density of the device.

FIG. 10 is a diagram showing exemplary voltage characteristics of a storage node Vs in the case of the binary data and two bit multiple value data.

Referring to FIG. 10, the binary data stored in the storage node Vs has a logic high value "1" or a logic low value "0". The logic low value "0" and the logic high value "1" correspond to the ground voltage level 0V and a power supply voltage level Vcc, respectively.

Whereas, the two bit multiple value data may have "00", "01", "10", and "11" value data. The "00", "01", "10", and "11" value data correspond to the ground voltage levels 0V, 250 mV level, 500 mV level, and 750 mV level, respectively.

FIG. 11 is a diagram for explaining a refreshing method of an MV DRAM according to an embodiment of the present invention.

Referring to FIG. 11, in the OFF state of the word line WL, the electric charges stored in the cell capacitor Cs are decreased due to a junction leakage current or a sub-threshold current of a transistor M3. Therefore, the level of the electric charges stored in the storage node Vs is decreased over time. Accordingly, a refresh operation needs to be performed before the data is destroyed due to loss of the electric charge.

In order to perform a refresh operation, the word line WL is enabled within a predetermined time before the data is destroyed due to loss of the electric charge. When the word line WL is enabled, the storage node Vs of the cell and the gate of the SET transistor have the same voltage level. Accordingly, the voltage level of the storage node Vs is restored to a voltage level before the electric charge loss according to the Coulomb blockage characteristic of the SET device.

In FIG. 11, it is assumed that the difference between the multiple value levels is 250 mV and the amount of current flow supplied from the current source transistor M2 is 100 pA. Moreover, it is assumed that the storage node Vs stores a voltage level of 1V during the write operation. When a voltage loss of about 100 mV is occurred in the OFF state of the word line WL, the word line WL is re-enabled.

Accordingly, the voltage level of the storage node SN is restored to 1V level by the 100 pA current supplied from the current source transistor M2. When the voltage level of the storage node SN is completely restored to 1V level, the word line WL is cut off and the corresponding voltage is stored. In this manner, the word lines are sequentially enabled before the data stored in the cell capacitor Cs is destroyed, thereby maintaining the data stored in each cell.

FIG. 12 is a diagram showing an MV DRAM cell array according to an embodiment of the present invention.

Referring to FIG. 12, MV DRAM cells are arrayed at intersections of word lines WL and bitlines BL. In addition, a current source transistor M2 for refreshing multiple value data, an SET device, and a transistor M1 for maintaining the drain voltage of the SET device are connected to each of the bitlines BL.

FIG. 13 is a diagram for explaining a refreshing method of an MV DRAM cell array shown in FIG. 12.

Referring to FIG. 13, the word lines WL<0>, WL<1>, and WL<3> are sequentially enabled for every refresh period tref. It is desirable that the refresh period tref is set so as to prevent the data stored in the cell capacitor Cs from being destroyed. Therefore, the voltage level stored in the cell capacitor Cs is maintained.

The MV DRAM refresh method according to the present invention is similar to the DRAM refresh method known in the art. However, the refresh method according to the present invention only needs to enable the word lines in order to rewrite the data, thereby eliminating the sense amplifier for a refresh operation, which was required in the known refresh method, in which the sense amplifier needs to be operated after the word lines are enabled in order to rewrite the data.

In addition, the known refresh method requires a large amount of current flow in order to refresh the data, whereas the refresh method according to the present invention requires only a small amount of current flow in order to rewrite the data. Accordingly, the MV DRAM refresh method according to the present invention is suitable for a low-power application.

According to the MV DRAM device of the present invention, since two or more multiple value data are stored in a cell, it is possible to increase the storage density of the device. In addition, since the MV DRAM device only needs to enable the word lines in order to rewrite the data, thereby requiring only a small amount of current flow, it is suitable for a low-power application.

Although the exemplary embodiments of the invention have been described in detail, the invention is not limited to the exemplary embodiments, but it will be understood by those skilled in the art that various modifications, additions and substitutions are possible without departing from the scope and spirit of the invention as disclosed in the accompanying claims.

What is claimed is:

1. An MV (multiple-valued) DRAM device for storing multiple value levels, the device comprising:
    one or more word lines;
    one or more bitlines;
    a DRAM cell connected to intersections of the word lines and the bitlines;
    a current source transistor having a source connected to a power supply voltage and a gate and a drain connected to the bitlines;
    an SET (single electron transistor) device having a gate connected to the bitlines and a source connected to the ground voltage; and
    a transistor connected between the bitlines and a drain of the SET device,
    wherein the gate of the transistor is connected to the ground voltage, and
    wherein the SET device comprises:
        the source and the drain formed on a semiconductor substrate;
        a metal island disposed between the source and the drain so as to form a tunnel junction between the source and the drain; and
        the gate disposed in the vicinity of the metal island so as to control electric current flowing through the metal island.

2. The device of claim 1, wherein the DRAM cell comprises:
    a cell transistor having a gate connected to the word lines and a drain connected to the bitlines; and
    a cell capacitor connected between a source of the cell transistor and the ground voltage.

3. The device of claim 1, wherein the transistor connected between the bitlines and the drain of the SET device is a depletion transistor that maintains the drain voltage level of the SET device at the ground voltage.

4. The device of claim 1, wherein the current source transistor is a depletion transistor.

5. The device of claim 1, wherein data stored in the DRAM cell is refreshed when the word lines are enabled.

6. The device of claim 1, further comprising a plurality of DRAM cells connected to intersections of a plurality of word lines and a plurality of bitlines,
    wherein the word lines are sequentially enabled at a predetermined period in order to refresh the DRAM cells.

* * * * *